United States Patent
Hong et al.

(12)

(10) Patent No.: US 6,245,672 B1
(45) Date of Patent: Jun. 12, 2001

(54) METHOD OF FORMING DIFFUSION BARRIERS FOR COPPER METALLIZATION IN INTEGRATED CIRUCITS

(75) Inventors: Qi-Zhong Hong; Wei-Yung Hsu; Jiong-Ping Lu, all of Dallas; Robert H. Havemann, Garland, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/177,412

(22) Filed: Oct. 23, 1998

(51) Int. Cl.$^7$ .............................................. H01L 21/4763
(52) U.S. Cl. .................................................. 438/648
(58) Field of Search ................................. 438/648, 637, 438/625, 646, 653, 586, 687, 644, 685, 655

(56) References Cited

U.S. PATENT DOCUMENTS 5,656,546 * 8/1997 Chen et al. ........................... 438/586
5,933,758 * 8/1999 Jain ...................................... 438/687

OTHER PUBLICATIONS

Aoki, et al., "A degradation–free Cu/HSQ damascene technology using metal mask patterning and post–CMP cleaning by electrolytic ionized water", *Technical Digest, International Eelctron Devices Meeting* (Dec. 7, 1997), pp. 31.4.1 through 31.4.4.

Sun, "Process technologies for advanced metallization and interconnect systems", *Technical Digest, International Electron Devices Meeting* (Dec. 7, 1997), pp. 31.1.1 through 31.1.4.

Zielinski, et al., "Damascene integration of copper and ultra–low–k xerogel for high performance interconnects", *Technical Digest, International Electron Devices Meeting* (Dec. 7, 1997), pp. 31.7.1 through 31.7.3.

Edelstein, et al., Full copper wiring in sub–0.25/spl mu/m CMOS ULSI technology, *Technical Digest, International Electron Devices Meeting* (Dec. 7, 1997), pp. 31.3.1 through 31.3.4.

* cited by examiner

Primary Examiner—David Nelms
Assistant Examiner—Quoc Hoang
(74) Attorney, Agent, or Firm—Peter K. McLarty; W. James Brady, III; Frederick J. Telecky, Jr.

(57) ABSTRACT

An integrated circuit structure including copper metallization (20, 32, 42), and a method of fabricating the same are disclosed. The structure includes a doped region (7) of a silicon substrate (9), which is typically clad with a metal silicide film (12) formed by way of direct react silicidation. At contact locations (CT) at which the copper metallization (20, 32, 42) is to make contact to the doped region (7), a chemically-densified barrier layer (16, 30, 38) provides a diffusion barrier to the overlying copper metallization (20, 32, 42). The chemically-densified barrier layer (16, 30, 38) is formed by an anneal of the structure to react impurities (14, 28, 36) with the underlying refractory-metal-based film (12, 34); the impurities are introduced by way of wet chemistry, plasma bombardment, or from the ambient in which the structure is annealed.

28 Claims, 11 Drawing Sheets

METHOD OF FORMING DIFFUSION BARRIERS FOR COPPER METALLIZATION IN INTEGRATED CIRUCITS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to metallization systems used for the conduction of electrical current therein.

For many years, aluminum metallization has been widely used in the fabrication of conductors in conventional integrated circuits. Aluminum metallization, either pure or doped with silicon, copper, or other impurities, has been used in the manufacture of integrated circuits, particularly because of its ease of deposition and ease of patterning and etching, while providing interconnections of reasonable conductivity. However, the use of aluminum necessitates subsequent manufacturing processes to be maintained at relatively low temperatures, given the low melting temperature of aluminum and also its reactivity with other materials, such as silicon. One such temperature-dependent failure mechanism is referred to in the art as "junction spiking". Junction spiking occurs when aluminum atoms diffuse to such an extent as to short a p-n junction between a doped diffused region at the contact and the underlying well region or substrate.

To prevent junction spiking in modern integrated circuits with very shallow junction depths, barrier metal layers are now commonly placed at contact locations in the integrated circuit. Conventional barrier materials to aluminum include titanium nitride, tantalum nitride, titanium-tungsten alloy, and other refractory materials (including elemental refractory metals, as well as compounds and alloys of the same). These diffusion barriers inhibit the diffusion of aluminum atoms into the underlying silicon at contact locations.

As is fundamental in the integrated circuit art, the chip area required to realize an integrated circuit relates inversely to the manufacturing cost of the integrated circuit. The reduction of manufacturing cost with smaller chip areas is due not only to the larger number of integrated circuits that may be simultaneously fabricated on the same semiconductor wafer, but also due to the increase in theoretical manufacturing yield resulting from smaller chip area (considering that smaller wafer area is rendered useless by a single defect, when chip sizes are smaller). Of course, the ability to manufacture transistors and other elements with smaller feature sizes translates directly into smaller integrated circuit chips for a given function. In addition, by reducing the feature sizes of integrated circuit elements, the resulting integrated circuit also achieves better electrical performance and reduced power dissipation, and may also incorporate a higher degree of functionality. One important dimension in the integrated circuit art is the "pitch" required for the formation of adjacent but electrically isolated metal conductors in an integrated circuit; in some circuit embodiments, the metal pitch may be the limiting factor in shrinking chip area.

The electrical resistance of a given metal conductor is, of course, defined by the reciprocal of the material conductivity, times the ratio of the length of the conductor to its cross-sectional area; in other words, the resistance of an integrated circuit is inversely proportional to its cross-sectional area. This relationship presents a limitation upon the ability to decrease the pitch of metal conductors in an integrated circuit, as smaller metal lines thus necessarily results in higher resistance. Aluminum metallization also suffers from a tendency to "electromigrate", where aluminum atoms move in response to the electrical current conducted by the metal line; because the electromigration rate depends upon the current density in the conductor, this failure mechanism also limits the extent to which an aluminum metal line may be reduced in cross-sectional area.

Copper has been an attractive material for the realization of integrated circuit conductors for such time, due to its much higher conductivity relative to aluminum. Additionally, copper is more stable, in the electromigration sense, than is aluminum; indeed, the use of copper as a dopant to reduce the rate of electromigration in aluminum metallization is well known in the art. As such, it is contemplated that copper metallization in integrated circuits will enable the reduction in feature size from that possible for aluminum, considering the improvement in conductivity and also the higher current density capability of this material.

However, as is also well known in the art, copper atoms diffuse very rapidly in silicon. For this reason, copper metallization has been avoided in many instances, particularly in metal-oxide-semiconductor (MOS) integrated circuits, as the presence of copper atoms can destroy the integrity of p-n junctions, and thus destroy the functionality of the integrated circuit. This effect of copper is commonly referred to as "poisoning" of junctions. Without adequate barrier materials, especially for MOS integrated circuits, the important benefits of copper metallization can not be achieved.

BRIEF SUMMARY OF THE INVENTION

It is therefore an object of the present invention to provide high integrity barrier layers for use in conjunction with copper metallization in integrated circuits, and methods of making the same.

It is a further object of the present invention to provide such barrier layers and methods that are well suited for use in integrated circuits having extremely small feature sizes.

It is a further object of the present invention to provide such barrier layers and methods that are suitable for use in integrated circuits having deep aspect ratio contacts and trench structures.

Other objects and advantages of the present invention will be apparent to those of ordinary skill in the art having reference to the following specification together with its drawings.

The present invention may be implemented in a method of fabricating integrated circuits utilizing one or more copper metallization layers that contact silicon and one another through barrier layers. According to the present invention, reactive impurities are introduced at exposed surfaces of refractory metal barrier material, at locations to be contacted by copper metal. Examples of the refractory metal barrier material include elemental titanium or tantalum, silicide compounds thereof, nitride compounds thereof, and the like; examples of the introduced and reacted impurities include elemental carbon, oxygen, and nitrogen. The resulting chemical densification of the barrier layer results in a layer that inhibits the diffusion of copper atoms therethrough.

DETAILED DESCRIPTION OF THE INVENTION

Figure 1A:
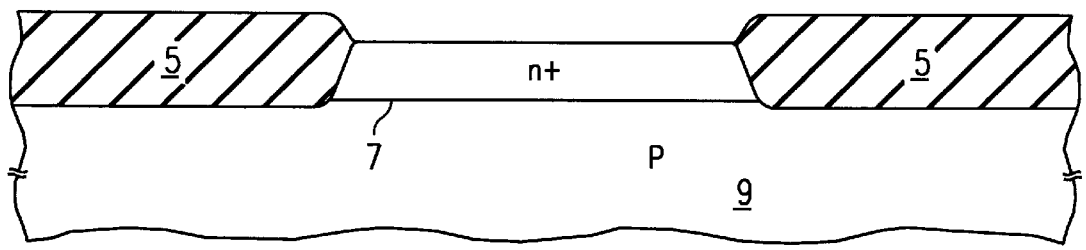
FIGS. 1a through 1i are cross-sectional diagrams illustrating the formation of an integrated circuit structure, at various stages of manufacture, according to a first preferred embodiment of the present invention.

As will become apparent from the following description, the present invention is beneficial in integrated circuits of many types, particularly those implemented according to metal-oxide-semiconductor (MOS) technology, and particularly those having multiple levels of metallization. It is of course contemplated that the present invention will also be beneficial in integrated circuits of other types, including logic circuits, and in integrated circuits fabricated according to other technologies including bipolar and BiCMOS integrated circuits, realized either in bulk silicon or in silicon-on-insulator (SOI) semiconductor material. The benefits provided by the present invention will be applicable to integrated circuits of various functional types, including logic circuits of programmable types such as microprocessors and digital signal processors, as well as non-programmable logic circuits, memory circuits, communication circuits and the like. In this regard, the present invention is particularly beneficial when utilized in connection with modern high-density circuits of the VLSI or ULSI scale, with feature sizes well into the sub-micron realm. Further, while the following description illustrates examples of the inventive integrated circuit structures and methods of making the same relative to semiconductor integrated circuit devices realized in silicon, considering the particular benefit of preventing the diffusion of copper atoms into silicon, it is of course contemplated that the present invention may alternatively be realized in connection with other semiconductor materials, such as germanium, gallium arsenide, and the like.

Referring first to the cross-sectional views of FIGS. 1a through 1i, a method of fabricating an integrated circuit structure according to a first preferred embodiment of the present invention will now be described in detail. The structures described herein correspond to contacts between conductive metallization elements and semiconductor elements at a surface of a semiconductor body (such semiconductor elements including both diffused regions into the semiconductor body as well as semiconductor structures that may be formed near a surface of the body but physically and electrically separated therefrom). As is, of course, fundamental in the art, these contact structures serve merely as a small part of a larger overall integrated circuit structure that includes active devices such as transistors, as well as other passive devices such as resistors and capacitors. These other active and passive devices are not expressly shown or described in the following description, as it is contemplated that the location and fabrication of such other devices is well understood by those in the art having reference to this specification.

Additionally, the preferred embodiments of the present invention will be described relative to cross-sectional views of the integrated circuit structures so formed. The layout arrangement of the various conductive and insulative elements within these structures, as seen from a top-down view, will of course depend upon the particular circuit function that is being realized; the present invention is contemplated to have no effect upon such layout, beyond its enabling of small pitch metal conductors realized in copper. As such, and considering that those of ordinary skill in the art will be readily able to comprehend potential plan view arrangements of the integrated circuit structures described herein, such plan views of the integrated circuit structures are not provided herein.

FIG. 1a illustrates an MOS integrated circuit structure at a partial stage of fabrication, in which field oxide structures 5, formed by way of conventional LOCOS (local oxidation of silicon) define the location at which diffused regions are to be formed into bulk silicon. In this example of FIG. 1a, n+ diffused region 7 is formed at the surface of p-type substrate 9. Alternatively, as is well understood, n+ diffused region 7 may be formed into a p-type well that it is itself formed within bulk silicon, or into a silicon-on-insulator layer; further in the alternative, it will of course be understood that the conductivity type of diffused region 7 may be either p-type or n-type, as contacts to each conductivity type regions will generally be made according to the preferred embodiments of the invention, particularly in integrated circuits fabricated according to complementary-metal-oxide-semiconductor (CMOS) technology. Referring back to the example of FIG. 1a, n+ diffused region 7 resides at an exposed surface of substrate 9, disposed between field oxide structures 5, at a location at which a metal contact is to be made, as will be described below. The junction depth of diffused region 7 in this example is quite shallow, for example on the order of 100 nm.

Figure 1B:
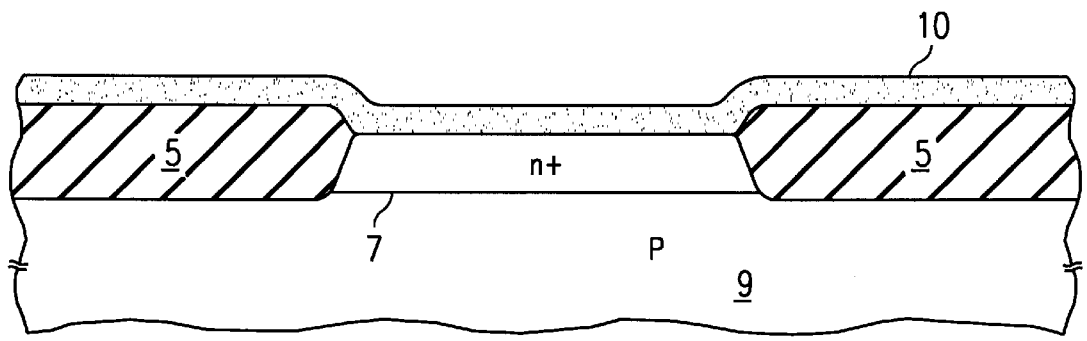

According to this first preferred embodiment of the present invention, the exposed surface of FIG. 1a is to be clad with a metal-silicide compound formed by way of direct react silicidation. FIG. 1b illustrates the integrated circuit structure after deposition of refractory metal layer 10 over the surface of the integrated circuit structure, for example by way of sputter deposition. In this example, refractory metal layer 10 is primarily elemental titanium, for forming an eventual titanium silicide cladding of diffused region 7. The thickness of titanium layer 10 is on the order of 20 nm, and overlies both diffused region 7 and field oxide structures 5. To the extent that polysilicon structures (not shown) such as transistor gates and interconnections are present, refractory metal layer 10 will, of course, also overlie these polysilicon structures as well. According to the direct react silicidation process, the integrated structure of FIG. 1b is then subjected to a high temperature anneal, preferably in a nitrogen ambient, to effect direct react silicidation of titanium layer 10. The temperatures to which the structure is subjected to perform this process may range from 600° C. to 750° C., and is preferably carried out by way of rapid thermal annealing (RTP), where the anneal is carried out quite rapidly, such as on the order of thirty seconds.

Figure 1C:
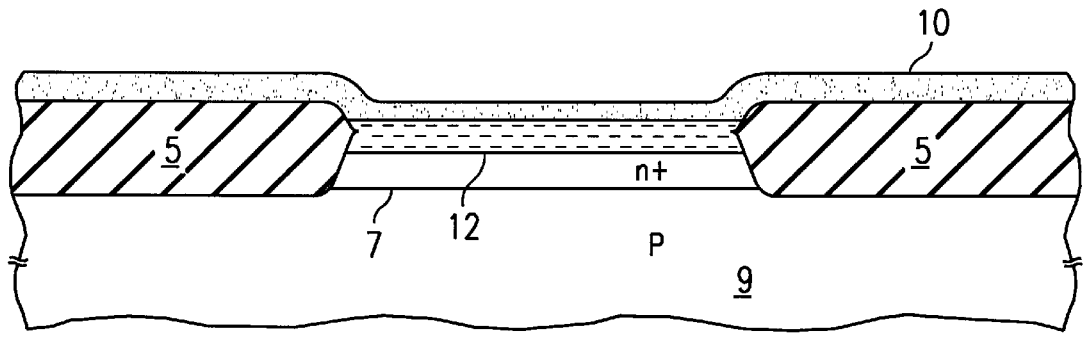

FIG. 1c illustrates the formation of titanium silicide film 12 at the surface of diffused region 7 as a result of the anneal process. In general terms, titanium layer 10 reacts with silicon at those locations at which layer 10 is in contact with silicon, which in the case of FIG. 1b is at the surface of diffused region 7; the portions of titanium layer 10 that are not in contact with silicon, such as overlying field oxide structures 5, remain at least partly unreacted, with the surface layer of titanium layer 10 having been converted to titanium nitride. Silicide film 12 extends into diffused region 7, due to the consumption of silicon in the formation of titanium silicide; similarly, silicide film 12 consumes some fraction of the thickness of titanium layer 10. The eventual thickness of silicide film 12 may be controlled through selection of the anneal parameters (i.e., time and temperature).

Figure 1D:
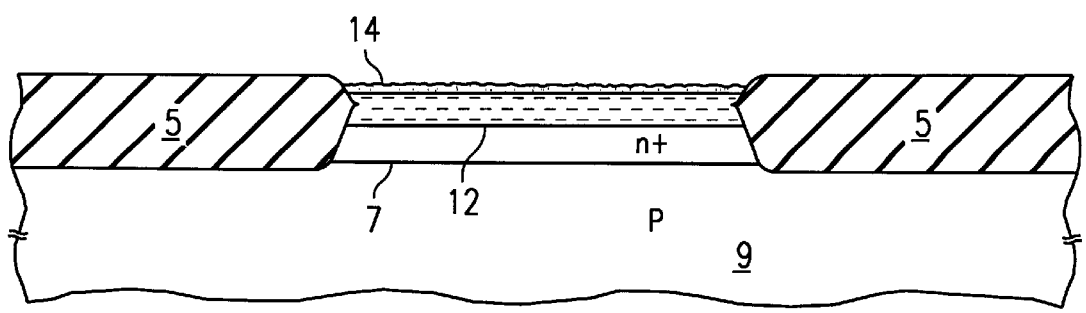

The unreacted titanium (and, to the extent present, titanium nitride) at the portions of layer 10 overlying field oxide structures 5, and also remaining at the exposed surface of layer 10 overlying silicon regions such as diffused region 7, are removed by way of etching. According to this first preferred embodiment of the invention, this etching operation is effected by way of a wet chemical etch, preferably using a hydrogen peroxide ($H_2O_2$) based wet chemical etchant. Insofar as removal of titanium nitride and unreacted titanium is concerned, the wet etch is selective, stopping on titanium silicide layer 12 and field oxide structures 5. In this example, in addition to removing the unreacted titanium, the wet chemical etch also leaves impurities 14 at the surface of titanium silicide film 12, as illustrated in FIG. 1d. Impurities 14, resulting from the wet etch removal of titanium layer 10, include nitrogen (perhaps from the titanium nitride) and oxygen (from the $H_2O_2$-based wet etch).

Figure 1E:
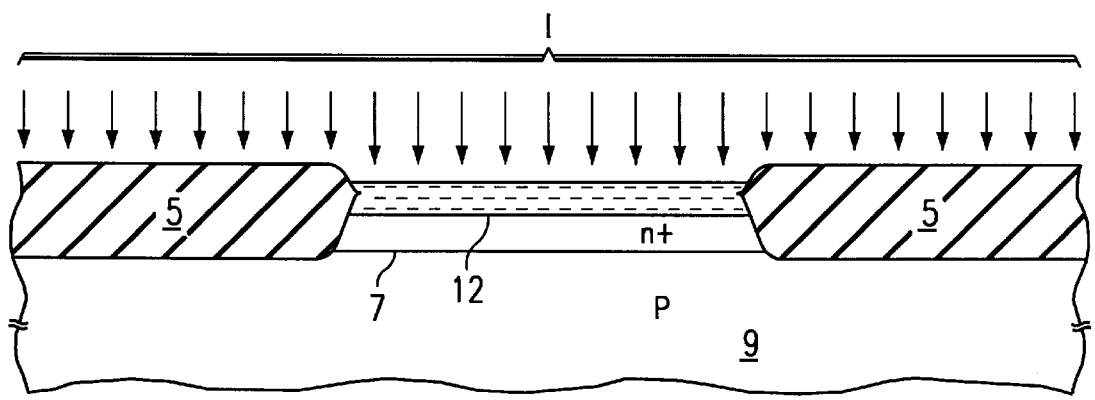

Alternatively to leaving impurities behind from a wet etch, impurities 14 may be introduced at the surface of silicide film 12 by way of plasma bombardment, as illustrated in FIG. 1e. In this alternative implementation, unreacted titanium layer 10 may be removed by way of a plasma etch, or a wet etch other than that involving oxygen-bearing etchant species. In this alternative, the desired amount and species (e.g., carbon, oxygen, or nitrogen) of impurities 14 is then disposed at the surface of silicide film 12, using a controlled plasma bombardment.

Figure 1F:
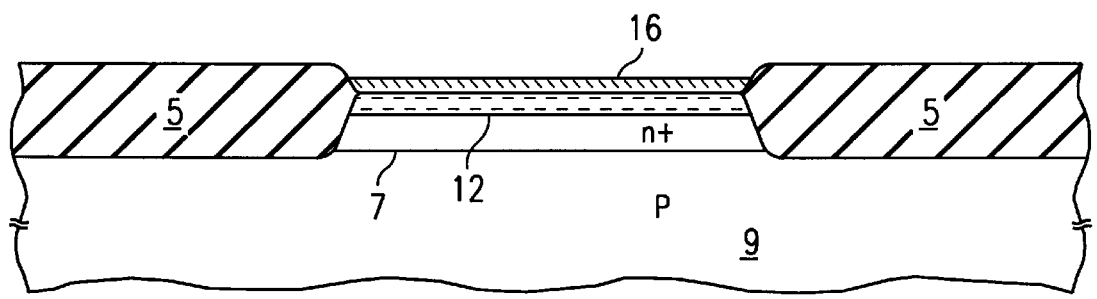

As a result of either the wet etch residue or plasma bombardment, the integrated circuit structure of FIG. 1d includes a concentration of impurities 14 at the surface of silicide film 12. A second anneal operation is then performed to react the impurities with titanium silicide film 12; additionally, this second anneal serves to transform titanium silicide film 12, formed during the first anneal, to a phase that has lower resistivity. An example of this second anneal operation is RTP in an inert or nitrogen ambient, at a temperature of on the order of 800° C. to 950° C. for on the order of thirty seconds. The reaction of impurities 14 with titanium silicide film 12 results in the formation of chemically densified barrier layer 16 at the surface of titanium silicide film 12, as illustrated in FIG. 1f. Chemically densified barrier layer 16 can be considered to be a non-stoichiometric compound of titanium, silicon, and the one or more species of impurities constituting impurities 14. For example, in the case where impurities 14 consist primarily of oxygen, chemically densified barrier layer 16 will be of the form $Ti_xSi_yO_z$, where x, y, and z correspond to the relative concentration of the various elements, which may not be uniform throughout barrier layer 16. It is contemplated that the thickness of barrier layer 16 will be quite thin, for example on the order of 10 nm. As a result, barrier layer 16 will not extend throughout the thickness of silicide film 12, but instead will reside at the surface of silicide film 12.

Figure 1G:
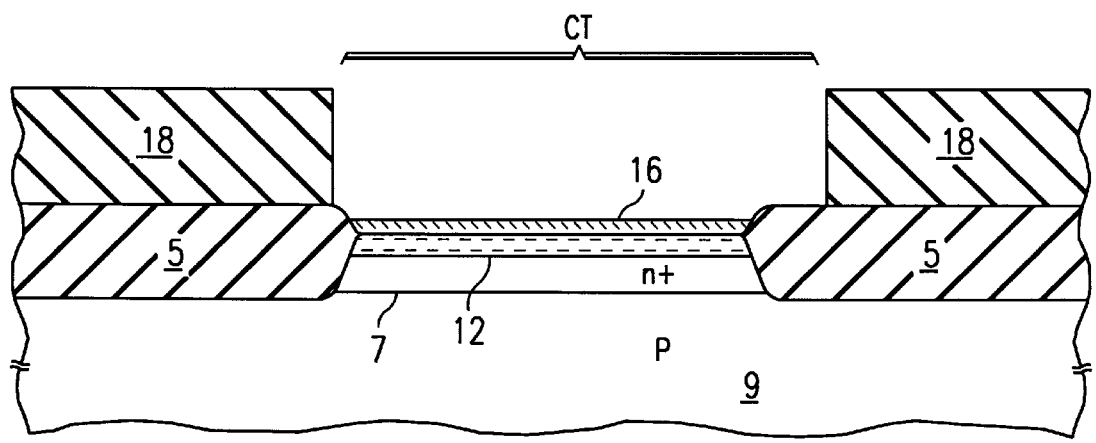

Referring now to FIG. 1g, the formation of copper metallization that is in electrical contact with diffused region 7 via silicide film 12 and barrier layer 16 will now be described. It is contemplated that the present invention may be utilized in connection with copper conductors that may be formed by way of various techniques. However, considering that non-volatile copper compounds are produced when copper films are exposed to conventional etchants, current copper metallization processes generally utilize a so-called damascene approach, in which the copper conductor lines are effectively inlaid into slots or tracks etched into an insulator. Insulator layer 18 is illustrated in FIG. 1g, and has an opening CT therethrough. Insulator layer 18 is typically silicon dioxide, but alternatively may be silicon nitride, or another electrically insulating material. By way of further example, as described in Zielinski, et al., "Damascene integration of copper and ultra-low-k xerogel for high performance interconnects", Technical Digest, International Electron Devices Meeting (IEEE, 1997), pp. 936–938, incorporated herein by this reference, insulator layer 18 may be realized as a multilayer film including xerogel, an adhesion layer, and silicon dioxide. In any event, according to conventional copper processing, contact opening CT is etched through insulator layer 18 at the location at which the eventual copper metallization structure is to be deployed. As suggested by FIG. 1g, insulator layer 18 may also be etched over field oxide structures 5 at those locations at which the copper metallization is to run thereover. It is understood that those in ordinary skill in the art having reference to this specification will readily comprehend the manner in which the locations of the copper metallization lines may be defined in this damascene manner.

Figure 1H:
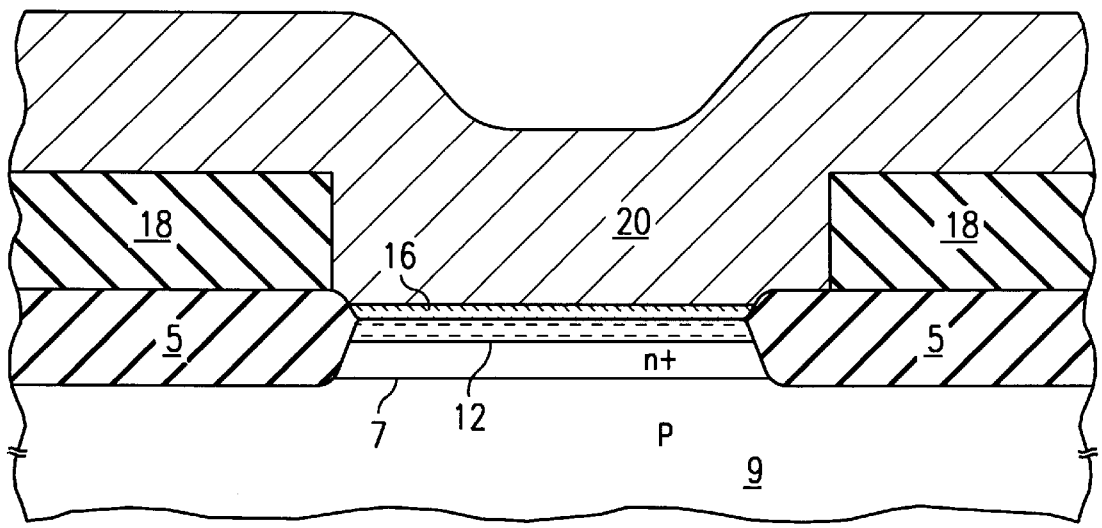
Figure 1I:
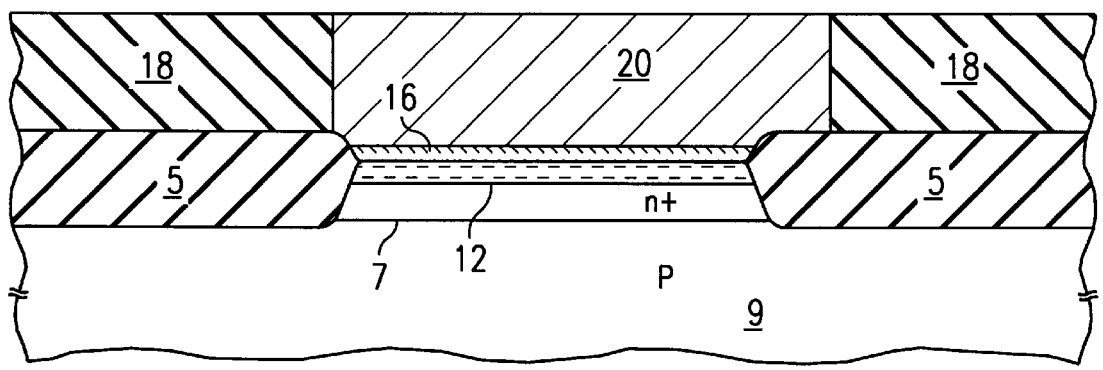

FIG. 1h illustrates the integrated circuit structure after the deposition of copper layer 20 overall. According to conventional copper processing, copper layer 20 is formed in two steps, with the first initial step depositing a relatively thin layer of copper overall as a seed layer for electroplating of copper. Prior to this seed layer, an adhesion layer, such as a refractory metal compound, examples of which include titanium nitride or tantalum nitride, may be deposited overall if desired. The seed layer deposition is conventionally carried out by way of physical vapor deposition (PVD) or chemical vapor deposition (CVD). The remainder of copper layer 20, which will generally be the large majority of the thickness of the copper film, is then electroplated overall, resulting in copper layer 20 of FIG. 1h. Definition of the actual copper conductor lines is then completed by chemical-mechanical polishing (CMP) of the wafer containing the integrated circuit structure, so that copper layer 20 is leveled off relative to the top surface of insulator layer 18, in this embodiment of the invention. FIG. 1i illustrates the result of this CMP processing in which copper layer 20 is removed from locations overlying defining insulating layer 18, but remains within contact opening CT and other locations of the surface of the integrated circuit structure at which copper conductor lines are to run.

Following the CMP processing that results in the definition of conductors formed of copper layer 20, as illustrated in FIG. 1i, additional insulating layers and copper conductive layers are then formed, for example by way of additional iterations of the damascene process. Vias through these further additional insulating layers may be filled with copper, tungsten, or some other metal, to interconnect multiple metallization layers. Additionally, these higher levels of metallization may also make direct contact to silicon structures such as diffused region 7 or polysilicon elements; it is contemplated that the additional embodiments described hereinbelow will be useful for making such contacts. Following the fabrication of all levels of metallization specified by the design of the overall integrated circuit, wafer fabrication will generally be completed by the application of a protective overcoat, through which openings to metal bond pads or other connective lands are made. Following wafer fabrication and any desired electrical testing of the integrated circuits in wafer form, such "back-end" processes as dicing of the individual circuits from the wafer, electrical test, packaging, burn-in, and additional electrical testing, are then typically performed to result in a packaged integrated circuit that may then be implemented into end equipment; it is understood that such additional wafer fabrication and back-end processes shall not constitute a material change in the integrated circuit structure described herein.

According to this first preferred embodiment of the invention, therefore, excellent electrical contact is made between copper layer 20 and diffused region 7, via silicide film 12 and barrier layer 16. Further, it has been observed that diffusion of copper atoms from copper layer 20, into diffused region 7 and substrate 9 is prevented by barrier layer 16 fabricated as described above; for example, a 10 nm barrier layer 16 has been observed to prevent copper diffusion therethrough at temperatures up to at least 550° C. Further, according to this first embodiment of the present invention, barrier layer 16 is readily formed without requiring an additional film deposition step, as impurities 16 are provided either as a by-product of the selected wet etchant, or by way of a blanket plasma bombardment operation. The present embodiment of the invention also maintains a low manufacturing cost, considering that barrier layer 16 is formed in a self-aligned manner.

Figure 2A:
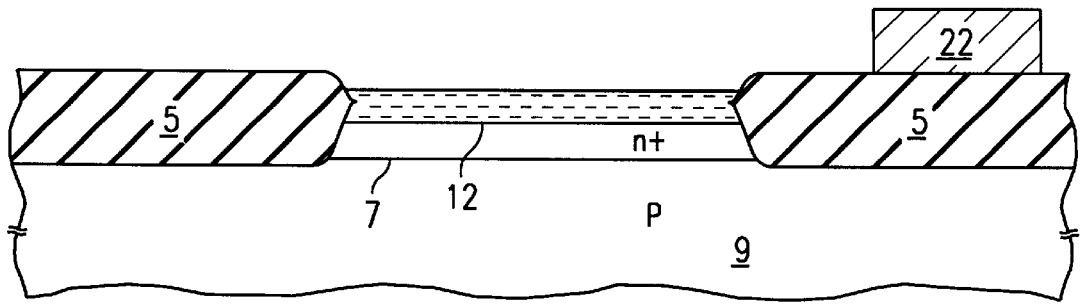
FIGS. 2a through 2h are cross-sectional diagrams illustrating the formation of an integrated circuit structure, at various stages of manufacture, according to a second embodiment of the present invention.

Referring now to FIGS. 2a through 2h, a method of fabricating an integrated circuit structure according to a second preferred embodiment of the present invention will now be described in detail. FIG. 2a illustrates, in cross-section, an integrated circuit structure in a partial stage of manufacture. Similarly as described above relative to FIG. 1a, the integrated circuit structure of FIG. 2a illustrates n+ diffused region 7 formed at a surface of p-type substrate 9, at a location between field oxide structures 5. Diffused region 7, in this example, is clad at this point in the process with silicide film 12, preferably by way of direct react silicidation of titanium metal, in the manner described hereinabove; in this regard, the unreacted titanium metal has already been stripped from the surface of the structure. Also in this example, polysilicon element 22 is in place over one of field oxide structures 5; polysilicon element 22 itself may be clad with silicide film in the conventional manner, if desired.

Figure 2B:
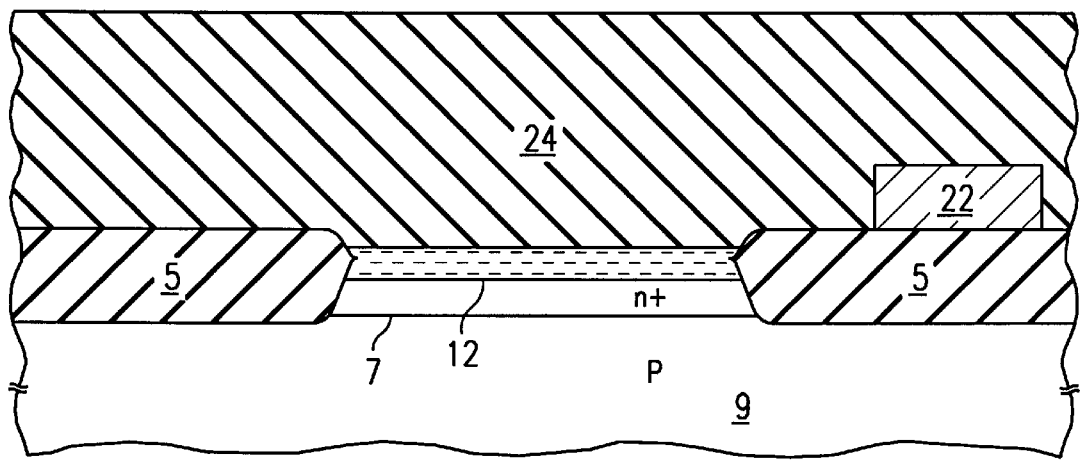

FIG. 2b illustrates the integrated circuit structure after the deposition of poly-metal dielectric film 24 which, as indicated by its name, serves as an insulating layer between underlying polysilicon structures (e.g., polysilicon element 22) and overlying metal conductors yet to be formed. Poly-metal dielectric film 24 conventionally consists of silicon dioxide, such as phosphorous-doped or boro-phosphorous doped silicon dioxide, deposited by way of CVD to a typical thickness of 800 nm. Either by way of reflow or chemical-mechanical polishing (CMP), poly-metal dielectric film 24 is preferably planarized as illustrated in FIG. 2b. As evident from FIG. 2b, poly-metal dielectric film fills in the region between field oxide structures 5, at which silicide film 12 is disposed at the contact location.

Figure 2C:
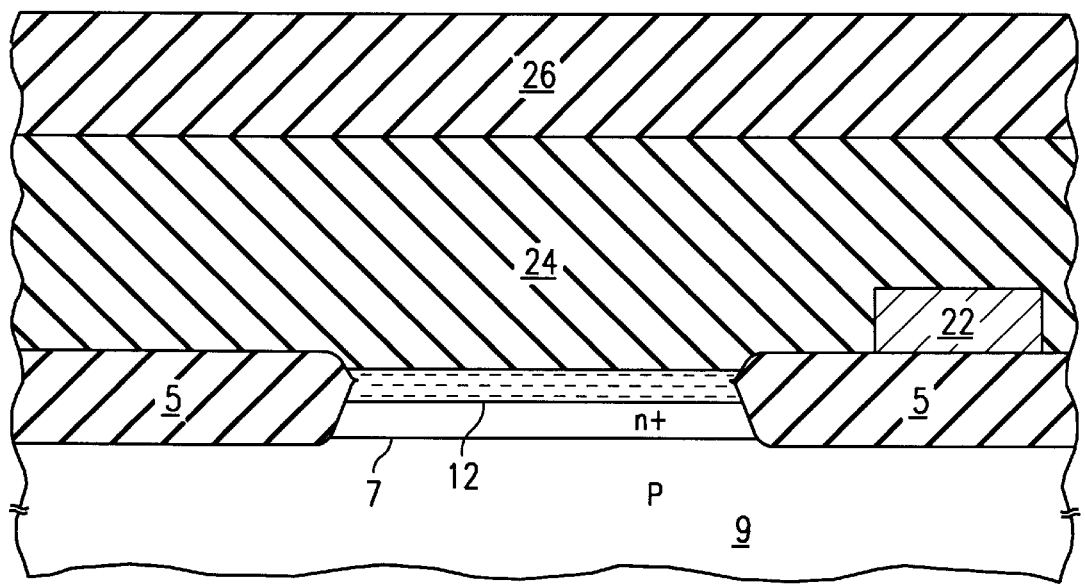

As shown in FIG. 2c, according to the preferred embodiment of the present invention, intra-metal dielectric film 26 is then deposited and planarized over poly-metal dielectric 24. As suggested by its name, intra-metal dielectric film 26 provides electrical insulation between adjacent metal conductors. Intra-metal dielectric film 26 may also consist of silicon dioxide, or may alternatively be formed of a lower "k" (i.e., lower dielectric constant) material such as xerogel, silicon nitride, or a combination of these materials. The method of deposition of intra-metal dielectric film 26, and its thickness, will of course depend upon the material used.

Figure 2D:
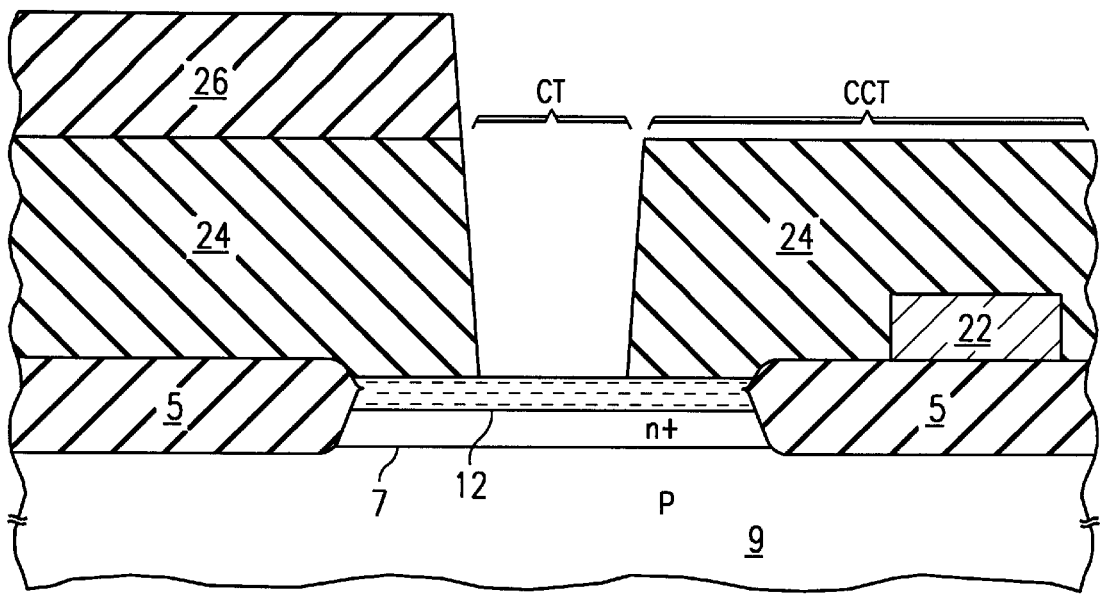

Following the deposition of poly-metal dielectric 24 and intra-metal dielectric film 26, the damascene process of copper deposition next begins with the patterning and etching of contact locations as well as the locations of copper conductors. According to the preferred embodiment of the invention, and as is conventional for damascene copper processing, a two-step pattern and etch is performed to define these two metal elements. The location of both contact locations and also copper conductors is defined by a first pattern and etch operation, where certain locations of intra-metal dielectric film 26 at which etching is to occur are defined by conventional photolithography, followed by the etching of intra-metal dielectric film 26 by plasma etch processing. The second step, by way of which contact locations are defined, is performed by photolithography defining and exposing contact locations in poly-metal dielectric film 24 (and also intra-metal dielectric film 26, if the first etch process does not completely remove the film), followed by plasma etch processing to etch fully through poly-metal dielectric film 24, exposing silicide film 12 at the contact locations. Alternatively, these openings may be formed by first etching the contact locations through both of films 26, 24, and by then defining the location of conductors by etching intra-metal dielectric film 26; this approach is used in some conventional damascene processes. FIG. 2d illustrates, in cross-section, the exemplary integrated circuit structure after the two-step contact and metal conductor etch, with contact location CT formed through both of intra-metal dielectric film 26 and poly-metal dielectric 24, and with conductor location CCT formed through intra-metal dielectric film 26.

Figure 2E:
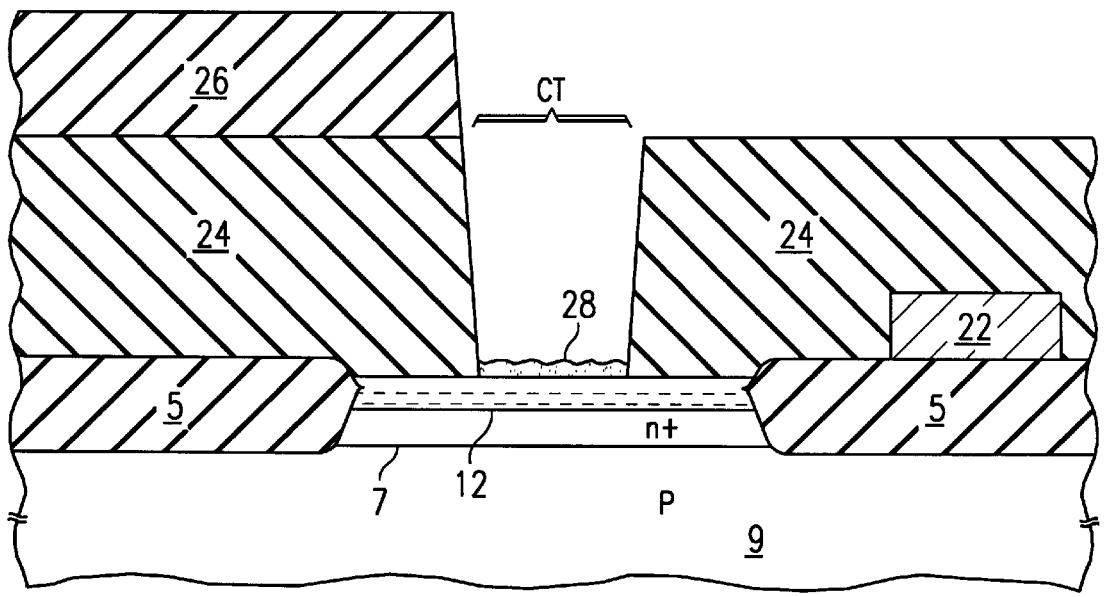

According to the preferred embodiment of the invention, as illustrated in FIG. 2e, impurities 28 are introduced at the surface of silicide film 12 at contact location CT. In this alternative embodiment of the invention, impurities 28 may be introduced by way of plasma bombardment, or alternatively by way of a wet chemical treatment of the structure that leaves impurities 28 as a residue. As described above, impurities 28 of FIG. 2e may include nitrogen, oxygen, carbon, or a combination of these species.

Figure 2F:
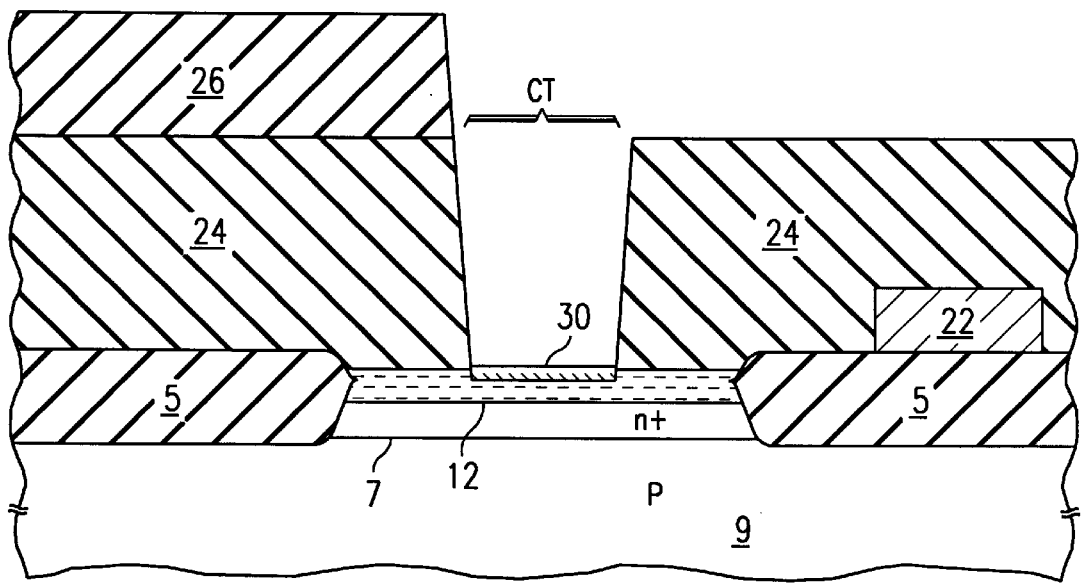

Following the introduction of impurities 28, a high temperature anneal is then performed to react impurities 28 with underlying silicide film 12. If not previously performed, this anneal operation may also densify titanium silicide film 12, increasing its conductivity. An example of this anneal operation is RTP in an inert ambient, at a temperature of on the order of 850° C. for on the order of thirty seconds. As in the previously described embodiment of the invention, the reaction of impurities 28 with silicide film 12 results in the formation of chemically densified barrier layer 30 at the surface of titanium silicide film 12 and within contact location CT, as illustrated in FIG. 2f. Properties of chemically densified barrier layer 30, such as its composition and thickness, are similar to barrier layer 16 described above relative to FIG. 1f, and as such is a relatively thin layer of a non-stoichiometric compound of titanium, silicon, and the species of impurities 28, residing at the surface of silicide film 12, as shown in FIG. 1f.

Figure 2G:
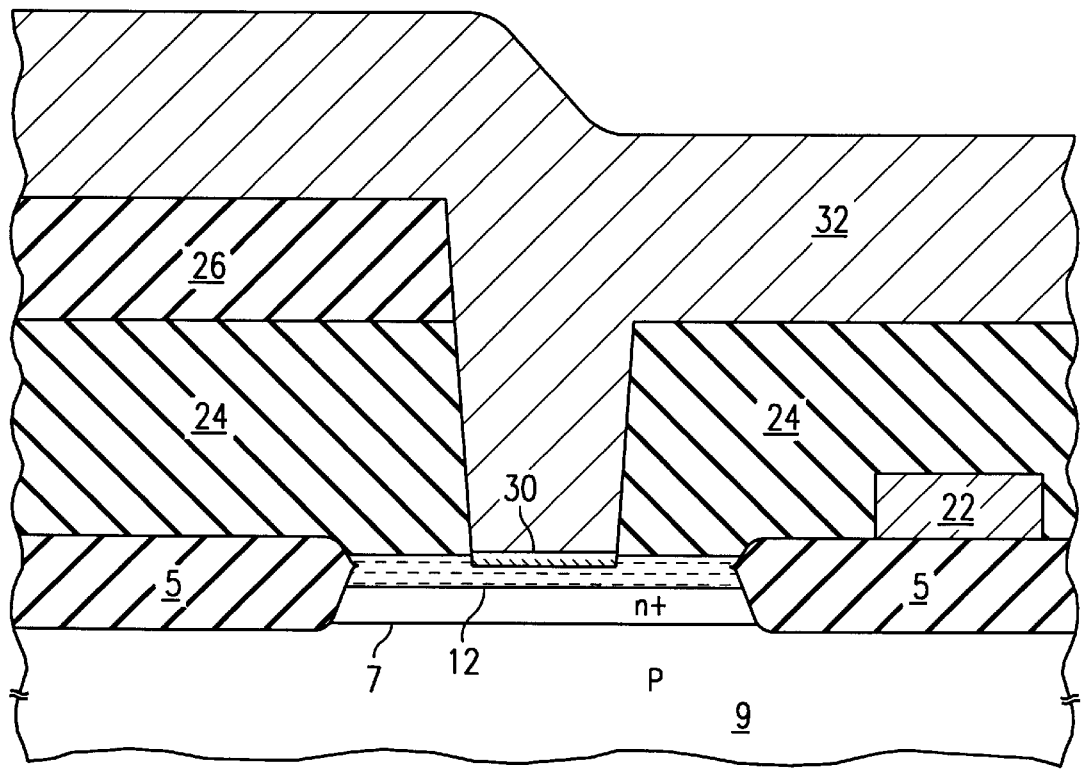

Following the formation of chemically densified barrier layer 30, copper metallization layer 32 is next formed overall, resulting in the structure shown in FIG. 2g. As described above, the deposition of copper metallization layer 32 according to modern processing techniques involves the PVD or CVD deposition of a seed layer of copper, followed by electroplating of copper to the desired thickness. The overall thickness of copper metallization layer 32 will, of course, depend upon the particular application, for example to a thickness of on the order of 500 nm. After deposition of copper metallization layer 32, chemical-mechanical polishing (CMP) is then performed to remove copper metallization layer 32 from all locations other than those defined by contact locations CT and conductor locations CCT, by planarizing copper metallization layer 32 and intra-metal dielectric film 26 to at least the top of film 26, resulting in the structure as shown in FIG. 2h.

Figure 2H:
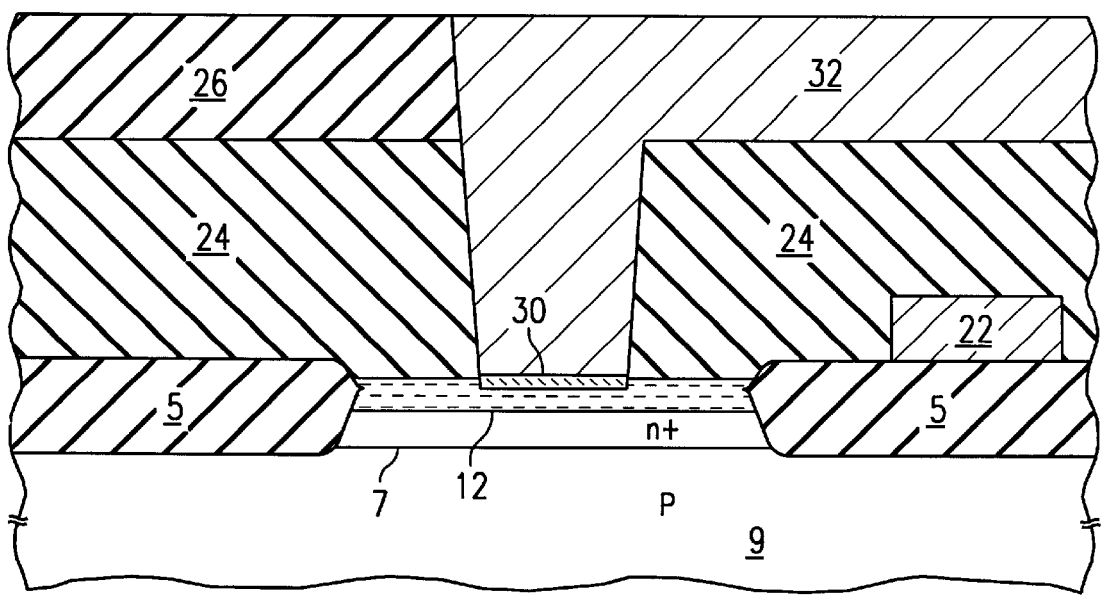

Following the CMP definition of copper metal conductor 32 as illustrated in FIG. 2h, the remaining processing described hereinabove to form additional insulating layers and copper conductive layers is then performed. These additional wafer fabrication manufacturing processes, as well as the so-called "back-end" processes described hereinabove, result in the eventual completion of the finished integrated circuit according to the preferred embodiment of the invention.

As described hereinabove relative to the first preferred embodiment of the invention, the integrated circuit structure resulting from the processes described relative to FIGS. 2a through 2h includes the significant benefits of copper metallization, including high conductivity and low electromigration risk, while minimizing the poisoning diffusion of copper atoms from metallization layers through the contact locations. Also as noted above, these benefits are obtained without involving additional high cost operations, such as an additional film deposition step, to form the chemically densified barrier layer underlying the copper metallization at contact locations; further, the chemically-densified barrier layer is formed according to this preferred embodiment of the invention in a self-aligned manner at the contact locations.

Referring now to FIGS. 3a through 3f, a method of fabricating an integrated circuit structure according to a third embodiment of the present invention will now be described. In this third embodiment of the invention, the copper metallization to be formed is a first level copper metal level, making contact to silicon as in the previously described embodiments of the invention. As will also be described relative to FIGS. 4a and 4b, the present invention may also be used in the formation of inter-level connections between copper metallization layers, with the barrier layer formed thereby being useful in inhibiting the diffusion of copper atoms into insulating layers such as silicon dioxide.

Figure 3A:
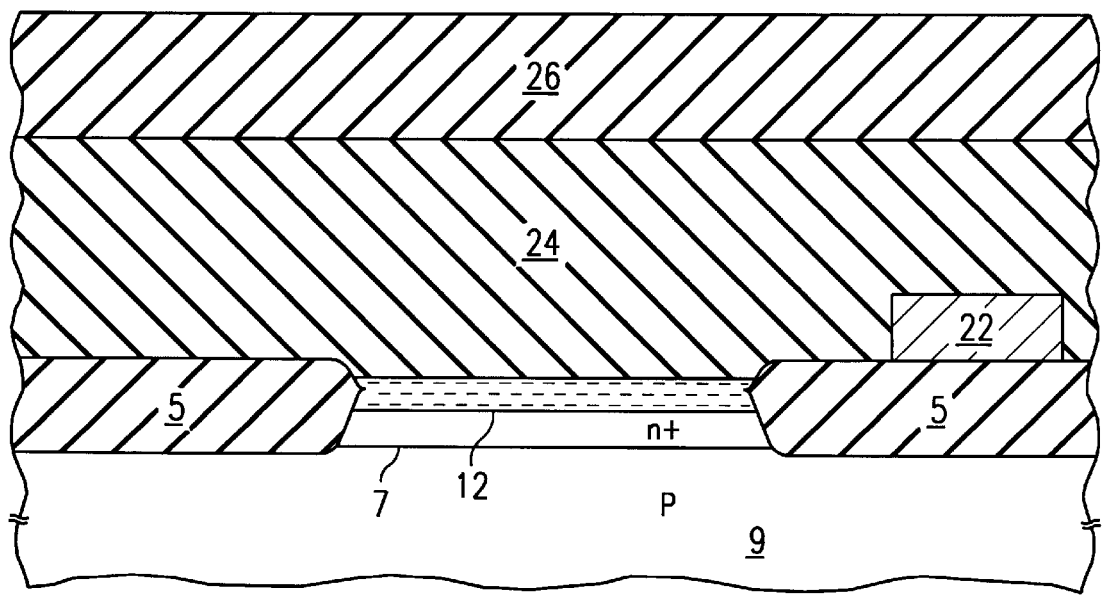
FIGS. 3a through 3f are cross-sectional diagrams illustrating the formation of an integrated circuit structure, at various stages of manufacture, according to a third embodiment of the present invention.
Figure 3B:
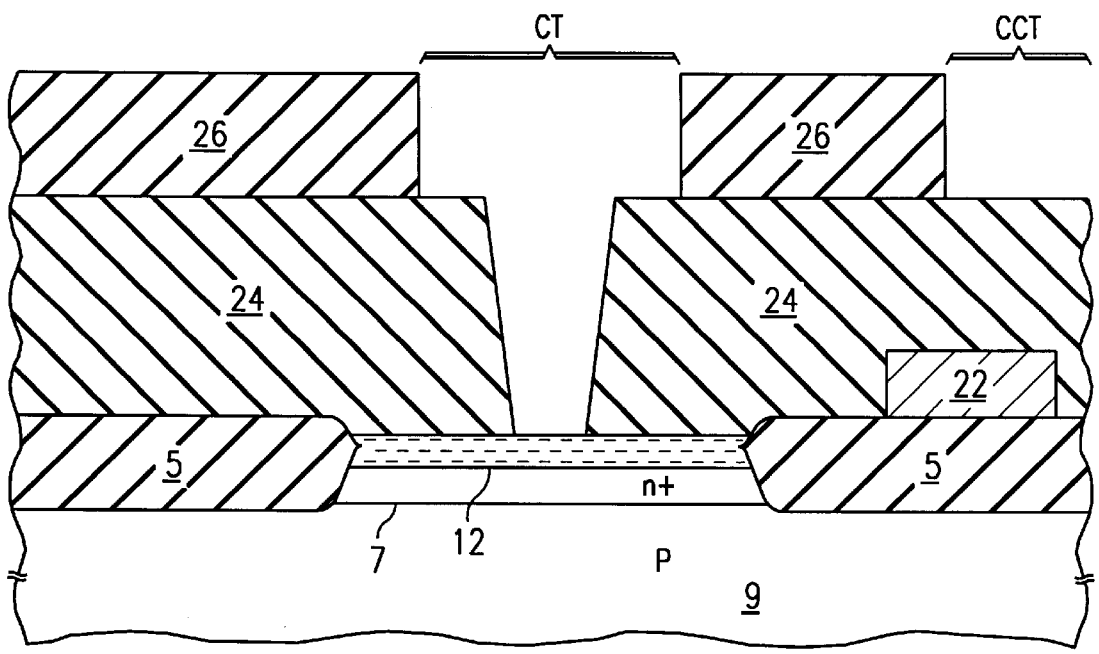

FIG. 3a illustrates, in cross-section, a partially fabricated integrated circuit structure. The structure of FIG. 3a includes, similarly as discussed above relative to FIGS. 1a and 2a et seq., n+ diffused region 7 disposed at a surface of p-type substrate 9, and clad with refractory metal silicide film 12. As noted above, silicide film 12 may be fabricated by way of direct react silicidation, or alternatively may be a deposited film. Polysilicon element 22 is disposed above one of field oxide structures 5, and is insulated on its top and sides by poly-metal dielectric film 24, which as before may consist of silicon dioxide.

In the integrated circuit structure formed according to this third embodiment of the invention, a contact is to be made from another copper metallization layer and the silicided surface of diffused region 7, by etching through each of dielectric films 26, 24 to form contact locations CT. According to the preferred embodiment of the invention, a two-step patterning and etching process is carried out, in which photolithographic patterning and etching of openings through intra-metal dielectric film 26 and through poly-metal dielectric film 24 is carried out. It is contemplated that those in the art will be readily able to design and carry out such a patterning and etch process according to conventional techniques. The result of the pattern and etch process is illustrated in the cross-section of FIG. 3b, where contact location CT extends fully through dielectric films 26, 24, exposing silicide film 12 at its bottom. Additionally, a conductor location CCT is also defined by this pattern and etch process, into which a copper metallization electrode may be disposed as will be described below.

Figure 3C:
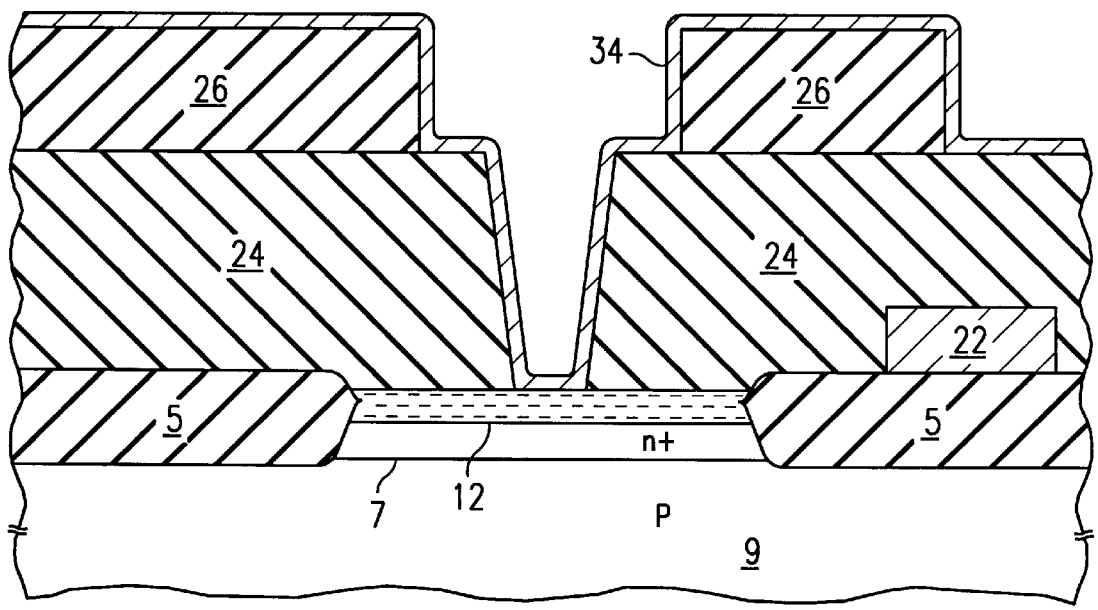

Referring now to FIG. 3c, according to this preferred embodiment of the invention, metallic film 34 is next deposited overall. Metallic film 34 may consist of a refractory metal in elemental form, a refractory metal alloy, or a compound of a refractory metal, deposited by way of PVD or CVD. Examples of metallic film 34 include elemental tantalum, elemental titanium, titanium silicide, tantalum silicide, and nitrides of tantalum and titanium. The overall thickness of metallic film 34 may be kept relatively thin, for example on the order of 10 nm.

Figure 3D:
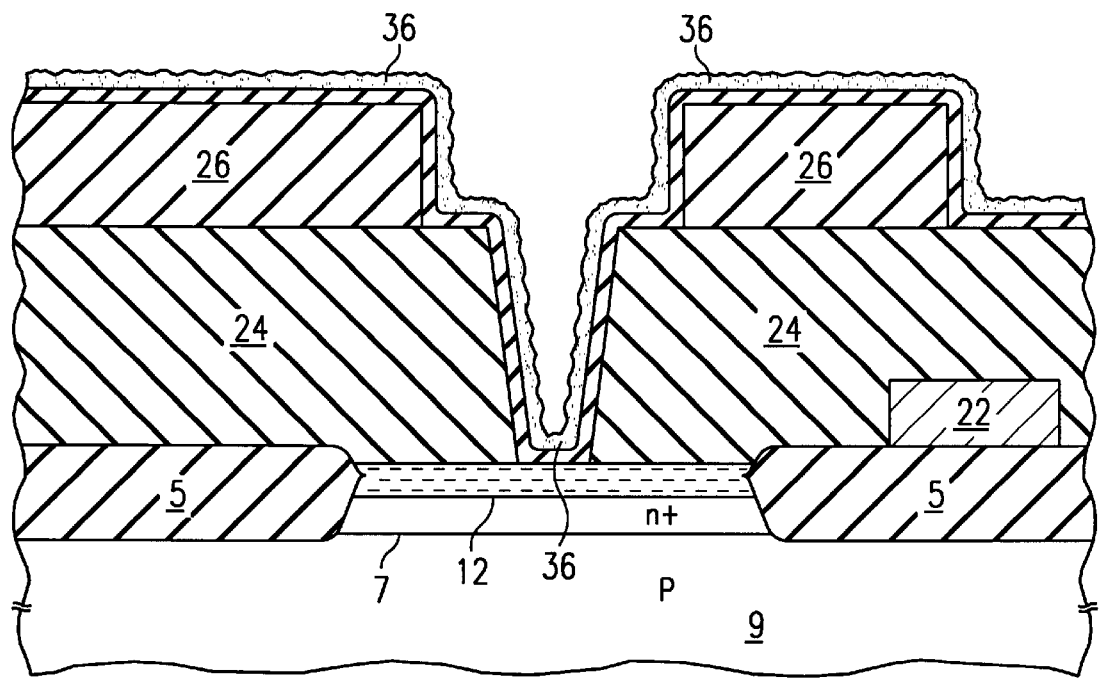

Following the deposition of metallic film 34, referring now to FIG. 3d relative to one implementation of this preferred embodiment of the invention, impurities 36 are introduced at the surface of metallic film 34. The species of impurities 36, as before, may be nitrogen, oxygen, or carbon, and the process of introduction of impurities 36 may be carried out by plasma bombardment, or simply by leaving a residue from a wet chemical treatment of the structure. As a result of this operation, impurities 36 are introduced at the surface of metallic film 34, as illustrated in FIG. 3d, present both on the flat portions of film 34, and also along the sidewalls of film 34 in the contact and trench locations.

Figure 3E:
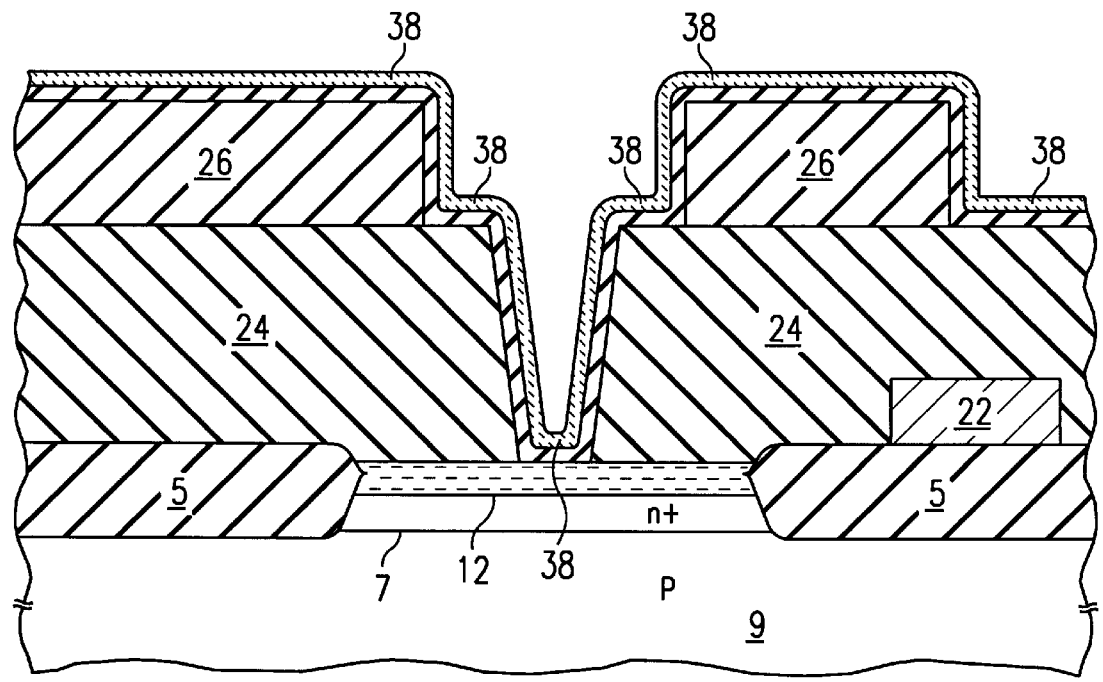

Following the introduction of impurities 36, a thermal anneal is then carried out to react the introduced impurities 36 with the constituents of metallic film 34, resulting in chemically densified barrier layer 38 at both the flat surfaces and the sidewalls of metallic film 34, as illustrated in FIG. 3e. According to the example where impurities 36 are introduced via wet or dry chemical processing, as described above, this thermal anneal is carried out in an inert ambient, for example at a temperature of 850° C. for thirty seconds, which is contemplated to be sufficient to carry out the reaction so as to form chemically densified barrier layer 38, as shown in FIG. 3e.

Alternatively, chemically densified barrier layer 38 may be formed without the introduction of impurities 36 following the etches through dielectric films 24, 26, by performing the chemical densification thermal anneal in an oxygen-bearing or nitrogen-bearing ambient. According to is alternative approach, chemically densified barrier layer 38 is the reaction product of species in the ambient of the anneal operation, with the refractory metal, alloy, or compound at the surface of metallic film 34. It is contemplated that the chemically-densified barrier layer 38 provided in this approach, and which appears, in cross-section, substantially as shown in FIG. 3e, will similarly provide a good barrier to the diffusion of copper atoms.

In either case, following the formation of chemically-densified barrier layer 38, both it and the remaining portion of metallic layer 34 must be removed from those locations of the integrated circuit structure at which the next level of copper metallization will not be present in the final circuit.

Figure 3F:
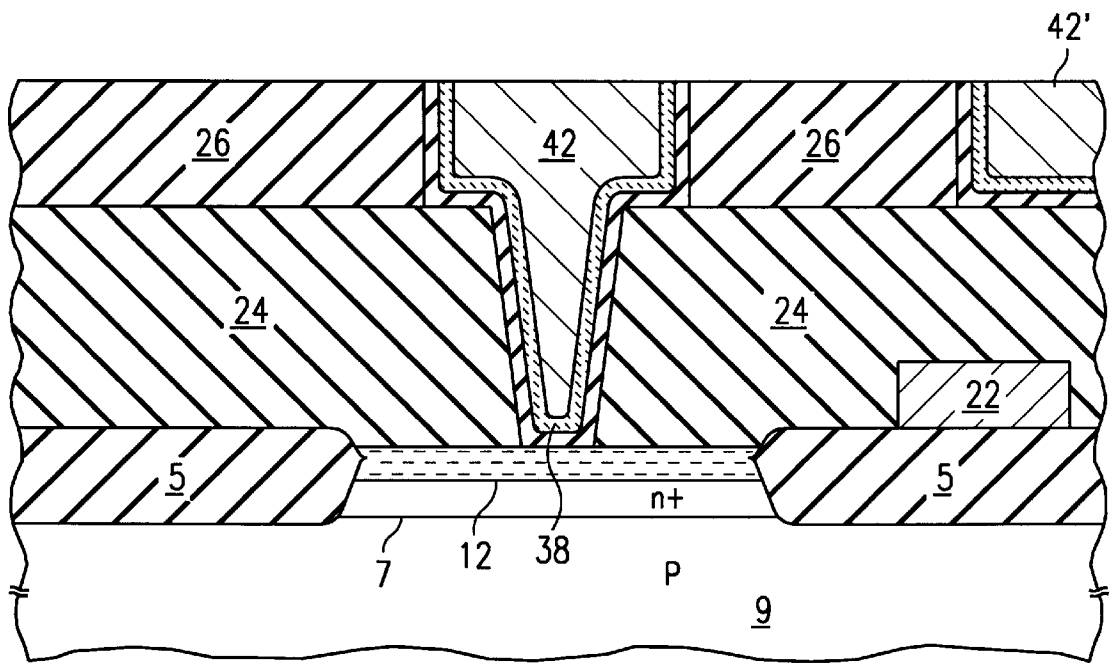

This removal will be accomplished by way of CMP during damascene formation of copper metallization layer 42, resulting in the structure of FIG. 3f, in which copper contact 42 and copper electrode 42' are provided in the integrated circuit structure. The CMP polishing involved in this damascene process removes all copper metallization from the surface of the structure, except within contact locations CT and conductor locations CCT, with the polishing extending slightly into film 26 so that any vestiges of layers 34, 38 are removed from all locations not underlying copper members 42. As shown in FIG. 3f, chemically-densified barrier layer 38 is present not only at the contact location at which copper layer 42 contacts diffused region 7, but also along the sidewalls of the contact and trench, and thus inhibits diffusion of copper atoms from copper layer 42 through diffused region 7 and into substrate 9, and also from copper layer 42 into insulating films 24, 26.

Following the fabrication of the structure illustrated in FIG. 3f, the remainder of the wafer fabrication and back-end processing described above is carried out, resulting in the finished integrated circuit.

This third preferred embodiment of the present invention may also be used to make connections between copper electrodes in different metallization layers. The formation of the barrier layer according to this embodiment of the invention is still beneficial in this case, even though no direct copper to silicon contact is being made, as the barrier layer is also useful to prevent diffusion of copper atoms into silicon dioxide and other insulating layers, such diffusion also being known to be deleterious to device functionality and performance, especially considering the high diffusivity of copper.

Figure 4A:
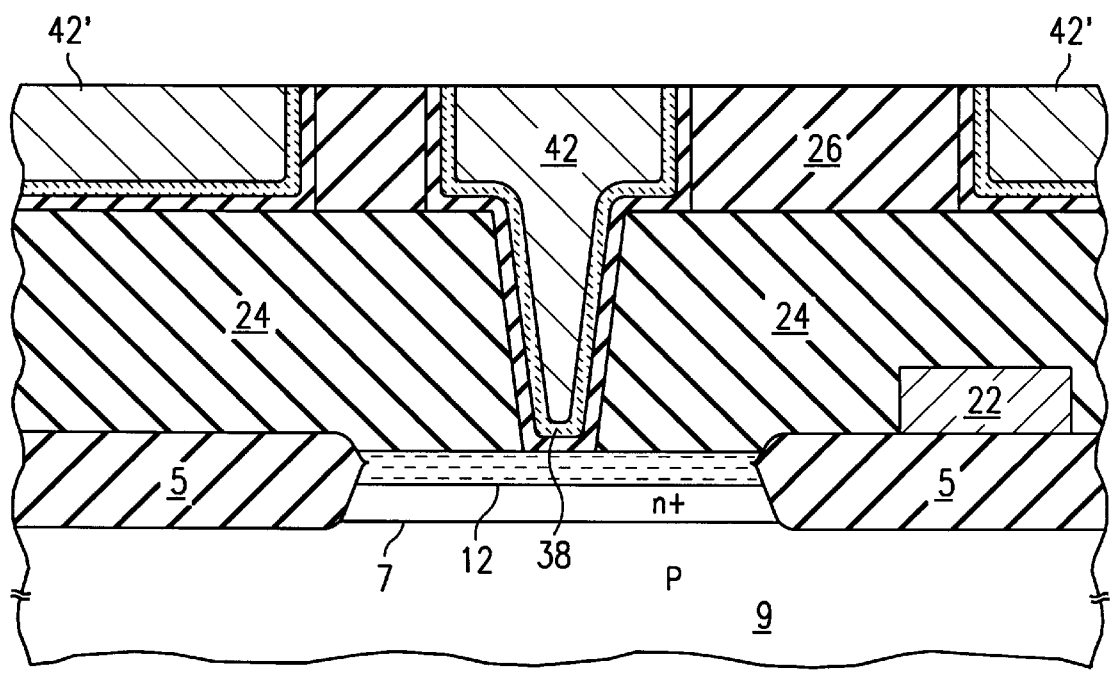
FIGS. 4a and 4b are cross-sectional diagrams illustrating the formation of a metal-to-metal via in an integrated circuit structure, according to the third embodiment of the present invention.

FIG. 4a illustrates, in cross-section, an integrated circuit structure at a similar stage of manufacture as that illustrated in FIG. 3f and described hereinabove. In the structure of FIG. 4a, copper electrode 42' is provided at the surface of the structure, to which electrical contact is to be made from a second, overlying, copper metallization level. The formation of this overlying copper metallization layer will be made in a manner according to this third embodiment of the invention, in which a chemically-densified barrier layer is utilized.

Figure 4B:
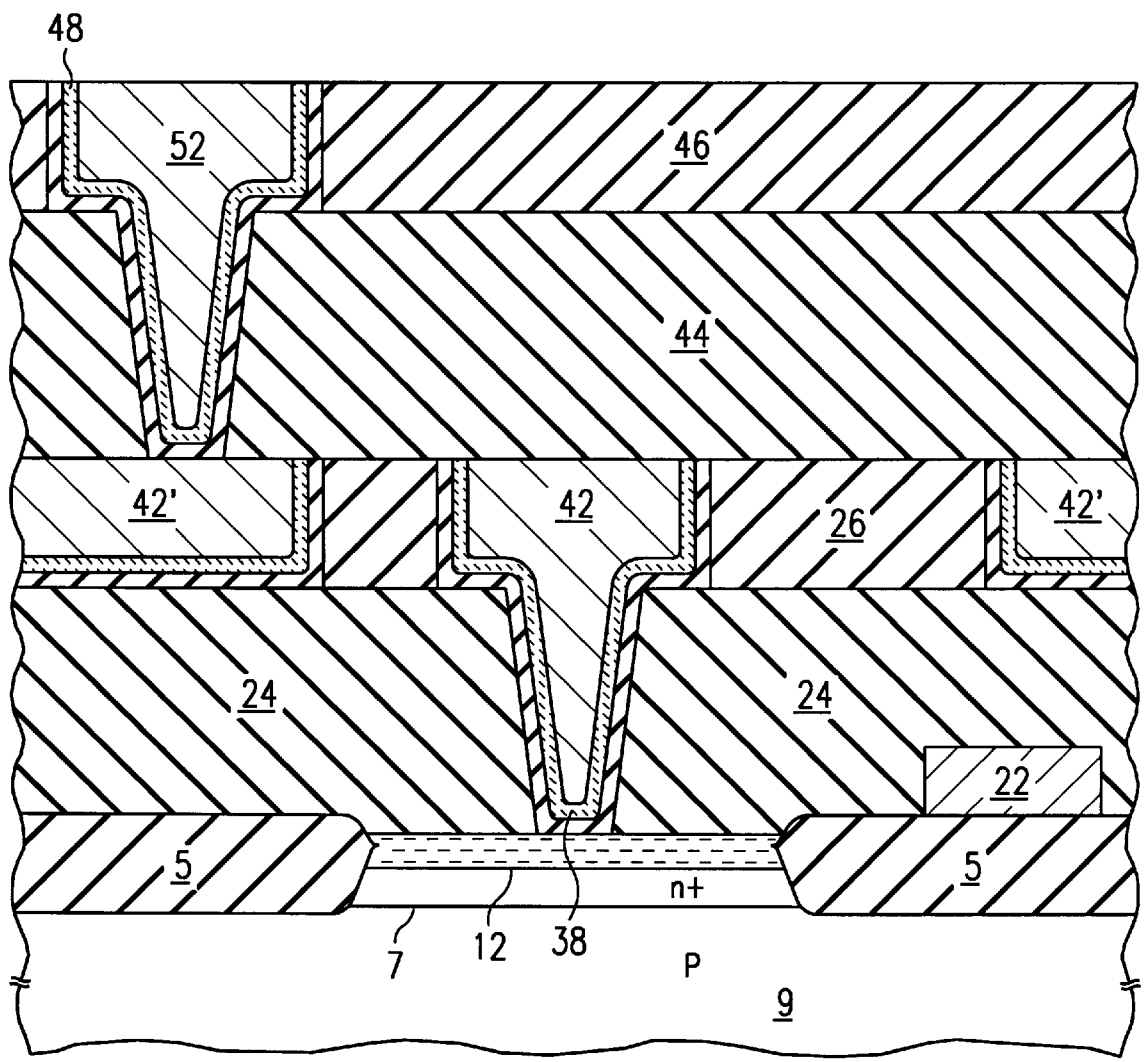

FIG. 4b illustrates the integrated circuit structure of FIG. 4a, after formation of second copper metallization level 52 according to this third preferred embodiment of the invention. The process of forming second copper level 52 is substantially the same as that described relative to FIGS. 3a through 3f, with via openings being etched through inter-level insulator film 44 and also through intra-level insulator film 46, films 44, 46 being formed of silicon dioxide or another suitable insulator. Chemically-densified barrier layer 48 is in place within the via underlying second copper level 52, and is formed in the manner described hereinabove. In this process, as described above, a metallic layer is disposed overall, and impurities are introduced thereinto; an anneal is then performed to react the impurities with the metallic layer to produce chemically-densified barrier layer 48 as shown in FIG. 4b. In this example of FIGS. 4a and 4b, however, because a lower level metallization level (i.e., the level of elements 42, 42') is in place, the thermal anneal process for causing reaction of the impurities is preferably carried out at a lower temperature, for example at 400° C. for thirty minutes, considering that the temperature to which metal conductor layers may be subjected is much less than that which semiconductor and insulator elements can withstand. Following formation of barrier layer 48 in this manner, copper metallization level 52 is then formed by way of a damascene process, as described hereinabove, leaving copper element 52 in the via location, making contact with underlying copper element 42' as shown in FIG. 4b.

It is contemplated that the process for making inter-level metal connections according to the third embodiment of the invention, as described relative to FIGS. 4a and 4b, is independent from the process for making contact to silicon according to this third embodiment of the invention, as described above relative to FIGS. 3a through 3f, such that an integrated circuit according to the present invention may be fabricated utilizing either or both of these processes. It is contemplated, of course, that the preferred approach to preventing copper diffusion into the integrated circuit structure include both such processes.

The third preferred embodiment of the present invention, as described above relative to FIGS. 3a through 3f and FIGS. 4a and 4b, provides a chemically densified barrier to the diffusion of copper atoms from metallization layers into diffused junctions and into dielectric films, even at relatively high temperatures such as 550° C. This effect enables the use of copper metallization in modern integrated circuits, including those of the MOS or CMOS type, and is readily implemented at relatively low cost into conventional manufacturing processes. Additionally, this third preferred embodiment of the invention provides the additional advantage that a non-reacted metallic layer is provided to serve as an adhesion layer for the copper metallization, further enabling the higher conductivity and lower electromigration risk of this important metal system.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of fabricating an integrated circuit, comprising the steps of:
   forming a doped region at a surface of a semiconductor body;
   forming, at an exposed surface of the doped region, a refractory-metal-based film;
   introducing carbon and/or oxygen containing impurities at the surface of the refractory-metal-based film;
   heating the semiconductor body to react the impurities with the refractory-metal-based film, to form a chemically-densified film at the surface of the refractory-metal-based film; and
   disposing copper metallization at selected locations of the surface of the semiconductor body, said copper metallization being in physical contact with the chemically-densified film.

2. The method of claim 1, wherein the step of forming a refractory-metal-based film comprises:
   cladding an exposed surface of the doped region with a metal silicide film;
   wherein the introducing step introduces carbon and/or oxygen containing impurities at the surface of the metal silicide film;
   and wherein the heating steps reacts the impurities with the metal silicide film, to form a chemically-densified film containing carbon and/or oxygen at the surface of the metal silicide film.

3. The method of claim 2, further comprising:

forming a first dielectric layer overall; and etching a contact opening through the first dielectric layer at a selected location of the surface of the doped region.

4. The method of claim 3, wherein the forming and etching steps are performed after the introducing step.

5. The method of claim 4, wherein the introducing step comprises:

plasma bombarding the surface of the metal silicide film with carbon and/or oxygen containing impurities.

6. The method of claim 4, wherein the introducing step comprises:

exposing the surface of the silicide film with a liquid comprising the carbon and/or oxygen containing impurities.

7. The method of claim 4, wherein the semiconductor body comprises silicon; and wherein the cladding step comprises:

depositing a refractory metal overall;

annealing the semiconductor body to react the refractory metal with silicon at locations at which the refractory metal is in contact with the doped region; and prior to the step of forming a first dielectric layer overall, etching remaining portions of the refractory metal that are not in contact with silicon.

8. The method of claim 7, wherein the step of etching remaining portions of the refractory metal introduces carbon and/or oxygen containing impurities at the surface of the metal silicide film.

9. The method of claim 7, wherein the step of introducing carbon and/or oxygen containing impurities comprises:

plasma bombarding the surface of the metal silicide film with carbon and/or oxygen containing impurities.

10. The method of claim 3, wherein the forming and etching steps are performed prior to the introducing step.

11. The method of claim 10, wherein the introducing step comprises:

plasma bombarding the surface of the metal silicide film with carbon and/or oxygen containing impurities.

12. The method of claim 10, wherein the introducing step comprises:

exposing the surface of the silicide film with a liquid comprising the carbon and/or oxygen containing impurities.

13. The method of claim 10, wherein the semiconductor body comprises silicon; and wherein the cladding step comprises:

depositing a refractory metal overall;

annealing the semiconductor body to react the refractory metal with silicon at locations at which the refractory metal is in contact with the doped region; and prior to the step of forming a first dielectric layer overall, etching remaining portions of the refractory metal that are not in contact with silicon.

14. The method of claim 13, wherein the step of etching remaining portions of the refractory metal introduces carbon and/or oxygen containing impurities at the surface of the metal silicide film.

15. The method of claim 13, wherein the step of introducing carbon and/or oxygen containing impurities comprises:

plasma bombarding the surface of the metal silicide film with carbon and/or oxygen containing impurities.

16. The method of claim 10, further comprising:

forming an intra-metal dielectric layer overall, after the step of forming the first dielectric layer overall; and etching contact and conductor openings through the intra-metal dielectric layer.

17. The method of claim 16, further comprising:

after the step of disposing copper metallization overall, performing chemical-mechanical polishing to remove copper metallization from locations other than the contact and conductor openings etched through the intra-metal dielectric layer.

18. The method of claim 17, wherein the step of depositing copper metallization comprises:

depositing a seed layer of copper overall; and electroplating copper onto the seed layer.

19. The method of claim 1, further comprising:

after the step of forming the doped region, forming at least a first dielectric layer overall; and etching a contact opening through the at least first dielectric layer at a selected location of the surface of the doped region;

wherein the step of forming the refractory-metal-based film comprises depositing a refractory-metal-based film overall, including into the contact opening.

20. The method of claim 19, wherein the refractory-metal-based film comprises elemental refractory metal.

21. The method of claim 19, wherein the refractory-metal-based film comprises an alloy of a refractory metal.

22. The method of claim 19, wherein the refractory-metal-based film comprises a compound of a refractory metal.

23. The method of claim 19, wherein the heating step heats the semiconductor body in an ambient including the carbon and/or oxygen containing impurities, so that the introducing step is performed simultaneously with the heating step.

24. A method of fabricating an integrated circuit, comprising the steps of:

forming a first metal element near a surface of a semiconductor body, the first metal element comprising copper;

forming at least one dielectric layer over the first metal element;

etching a via opening through the at least one dielectric layer so as to expose a portion of the first metal element;

then depositing a refractory-metal-based film overall, so that the refractory-metal based film is in contact with the first metal element at the via location;

introducing impurities at the surface of the refractory-metal-based film;

heating the semiconductor body to react the impurities with the refractory-metal-based film, to form a chemically-densified film at the surface of the refractory-metal-based film; and disposing copper metallization at selected locations of the surface of the semiconductor body, said copper metallization being in physical contact with the chemically-densified film.

25. The method of claim 24, wherein the refractory-metal-based film comprises elemental refractory metal.

26. The method of claim 24, wherein the refractory-metal-based film comprises an alloy of a refractory metal.

27. The method of claim 24, wherein the refractory-metal-based film comprises a compound of a refractory metal.

28. The method of claim 24, wherein the heating step heats the semiconductor body in an ambient including the impurities, so that the introducing step is performed simultaneously with the heating step.

* * * * *